(12) United States Patent
Kim

(10) Patent No.: US 9,263,383 B2
(45) Date of Patent: Feb. 16, 2016

(54) ANTI-FUSE ARRAY OF SEMICONDUCTOR DEVICE AND METHOD FOR OPERATING THE SAME

(71) Applicant: SK HYNIX INC., Icheon (KR)

(72) Inventor: Sung Su Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/267,810

(22) Filed: May 1, 2014

(65) Prior Publication Data

US 2015/0146471 A1    May 28, 2015

(30) Foreign Application Priority Data

Nov. 26, 2013    (KR) ........................ 10-2013-0144721

(51) Int. Cl.
| | |
|---|---|
| *G11C 17/18* | (2006.01) |
| *H01L 23/525* | (2006.01) |
| *H01L 27/112* | (2006.01) |
| *G11C 17/16* | (2006.01) |

(52) U.S. Cl.
CPC ............ *H01L 23/5252* (2013.01); *G11C 17/16* (2013.01); *H01L 27/11206* (2013.01); *H01L 2924/0002* (2013.01)

(58) Field of Classification Search
CPC ..................................................... G11C 17/16

USPC ........................................................... 365/96
See application file for complete search history.

(56) References Cited

U.S. PATENT DOCUMENTS

| | | | | |
|---|---|---|---|---|
| 6,700,176 | B2* | 3/2004 | Ito et al. ........................ | 257/530 |
| 6,992,925 | B2* | 1/2006 | Peng ............................. | 365/177 |
| 7,402,855 | B2* | 7/2008 | Kurjanowicz ................. | 257/288 |
| 7,755,162 | B2 | 7/2010 | Kurjanowicz et al. | |
| 8,674,475 | B2* | 3/2014 | Kim et al. ..................... | 257/530 |
| 8,748,235 | B2* | 6/2014 | Mitchell et al. ............... | 438/130 |
| 8,982,648 | B2* | 3/2015 | Onuma et al. ........... | 365/189.16 |
| 9,000,560 | B2* | 4/2015 | Sung ............................. | 257/530 |
| 2004/0125671 | A1* | 7/2004 | Peng ............................. | 365/200 |
| 2010/0110750 | A1* | 5/2010 | Namekawa .................... | 365/96 |
| 2011/0103127 | A1* | 5/2011 | Kurjanowicz ................. | 365/96 |
| 2012/0057423 | A1 | 3/2012 | Chen et al. | |
| 2012/0120733 | A1 | 5/2012 | Son et al. | |
| 2014/0346603 | A1* | 11/2014 | Toh et al. ...................... | 257/350 |

FOREIGN PATENT DOCUMENTS

KR    10-2012-0052454 A    5/2012

* cited by examiner

*Primary Examiner* — Son Mai

(57) ABSTRACT

An anti-fuse array includes: a plurality of first transistors having a matrix structure over a semiconductor substrate; a plurality of second transistors respectively disposed adjacent to first ends of the plurality of first transistors along a first direction of the matrix structure; and a plurality of third transistors respectively disposed at second ends of the plurality of first transistors along a second direction.

20 Claims, 6 Drawing Sheets

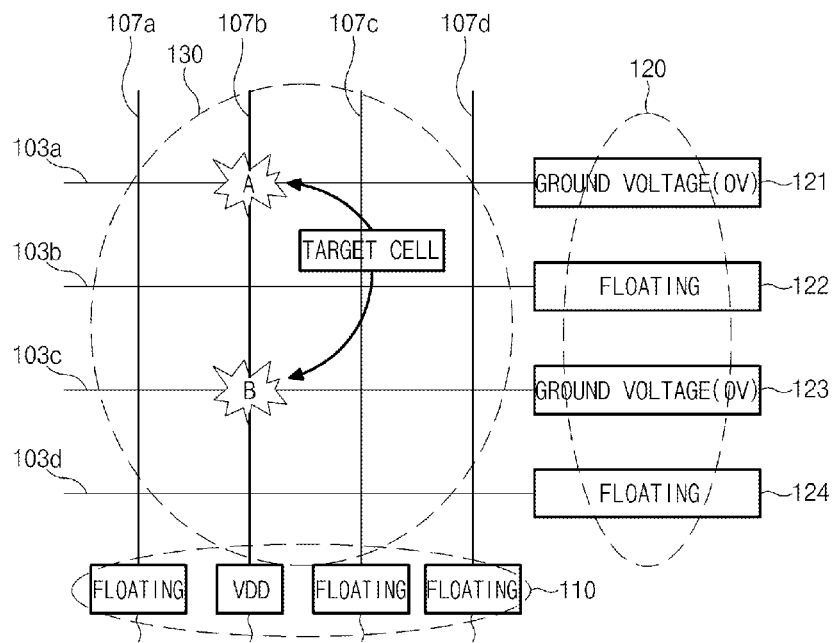
Fig.5 (i)
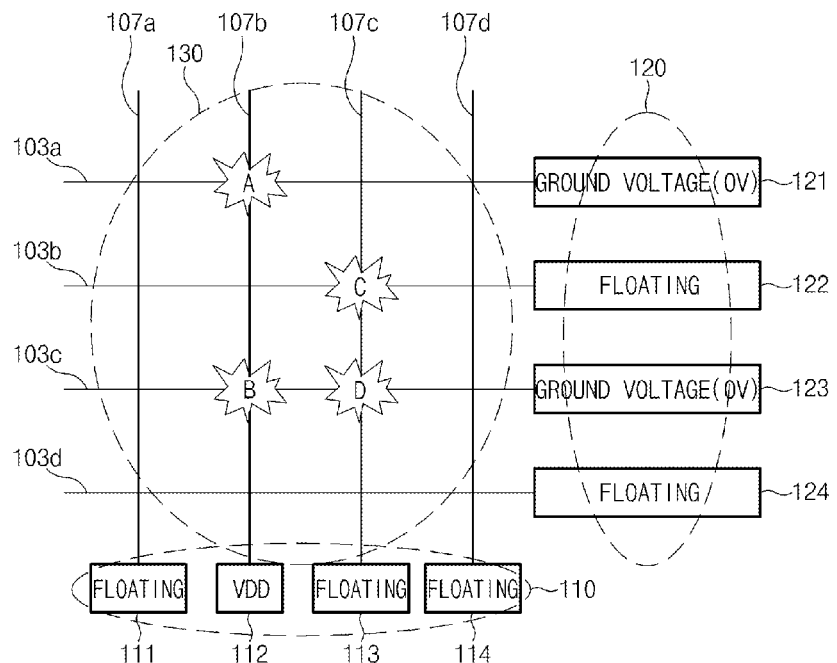
Fig.5 (ii)

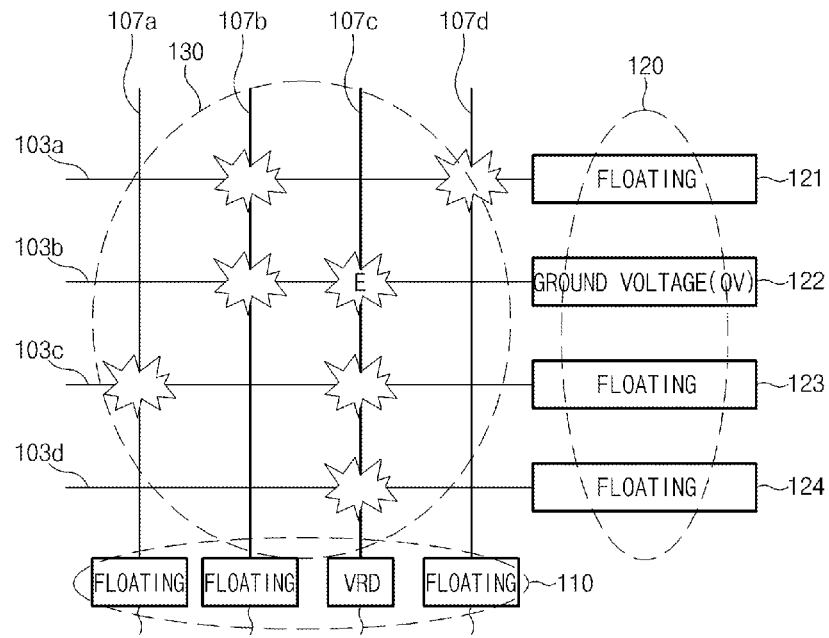
Fig.6 (i)
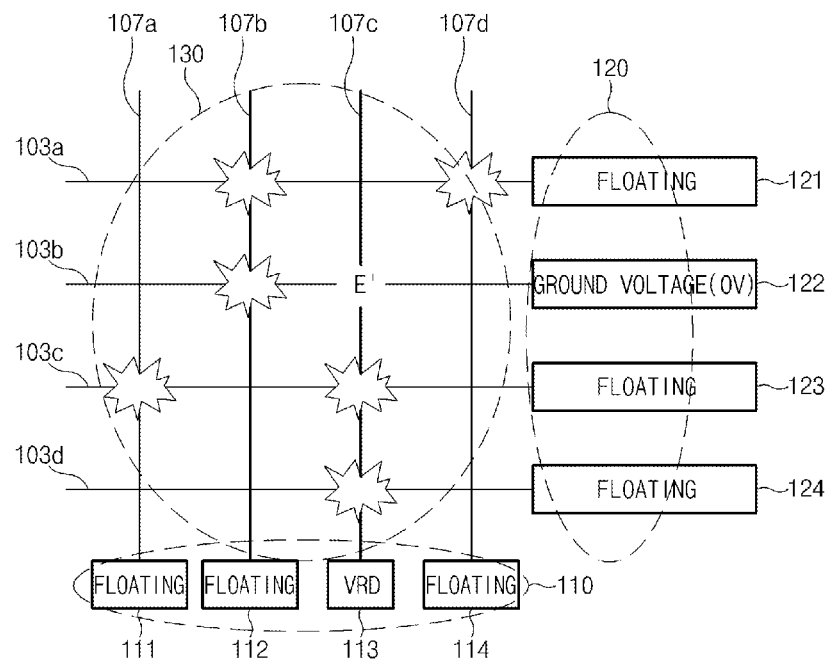
Fig.6 (ii)

ANTI-FUSE ARRAY OF SEMICONDUCTOR DEVICE AND METHOD FOR OPERATING THE SAME

CROSS-REFERENCE TO RELATED APPLICATION

The priority of Korean patent application No. 10-2013-0144721 filed on 26 Nov. 2013, which is hereby incorporated by reference in its entirety, is claimed.

BACKGROUND

Embodiments relate to an anti-fuse array of a semiconductor device and a method for operating the same, and more particularly to an anti-fuse array technology capable of reducing an area of the anti-fuse array.

In recent times, as information media such as computers have been widely used, technology of a semiconductor device has been developed. Functionally, it is desirable for a semiconductor device to operate at a high speed and to have a large amount of data storage capacity. Therefore, technology for manufacturing semiconductor devices has been developed to increase a degree of integration, reliability, a response speed, and the like.

Defective cells may occur in the fabrication process of a semiconductor device. The defective cells may be detected in early stages of the fabrication process and the functionality of the defective cells may be restored by a repair process.

Anti-fuses are desirable for the above-mentioned repair process. For example, anti-fuses may allow the repair process to be performed on a semiconductor device that has been packaged. On the other hand, increased number of net dies, improved product characteristics, and high degree of integration of a semiconductor device lead to high dependence on devices using a conventional laser fuse and fabrication methods of such devices. Anti-fuses may also be used to reduce this high dependence. Because of the above-mentioned characteristics of the anti-fuse, the anti-fuse has been widely used in various technical fields.

BRIEF SUMMARY

Various embodiments are directed to providing an anti-fuse array of a semiconductor device and a method for operating the same, which may address one or more issues of the related art.

An embodiment relates to a technology for increasing productivity by reducing an area of an anti-fuse array.

In accordance with an embodiment, an anti-fuse array includes: a plurality of first transistors formed as a matrix structure over a semiconductor substrate, the plurality of first transistors including a plurality of gate lines formed along a first direction, a plurality of channel lines formed along a second direction, a plurality of second transistors respectively formed adjacent to first ends of the plurality of gate lines; and a plurality of third transistors respectively formed at second ends of the plurality of channel lines.

In accordance with an embodiment, a method for operating an anti-fuse array which includes a plurality of first transistors formed as a matrix structure over a semiconductor substrate, a plurality of second transistors respectively formed adjacent to first ends of the plurality of first transistors along a first direction of the matrix structure, and a plurality of third transistors respectively formed at second ends of the plurality of first transistors along a second direction, the method includes: applying a first voltage to the plurality of first transistors sing a first transistor among the plurality of second transistors; applying a second voltage to the plurality of first transistors using a second transistor among the plurality of third transistors; and rupturing a third transistor among the first plurality of transistors located at an intersection of a gate line coupled to the first transistor and a channel line coupled to the second transistor due to a voltage level difference across a gate insulation film of the third transistor corresponding to a difference between the first voltage and the second voltage.

Wherein, during a program operation, the first voltage is a power-supply voltage (VDD), and the second voltage is a ground voltage.

The method further comprises applying a third voltage to the plurality of first transistors using a fourth transistor among the plurality of second transistors, and applying a fourth voltage to the plurality of first transistors using a fifth transistor among the plurality of third transistors, and performing a read operation on a sixth transistor among the plurality of first transistors located at an intersection of a gate line coupled to the fourth transistor and a channel line coupled to the fifth transistor.

Wherein, during the read operation, the third voltage is a read voltage, and the fourth voltage is a ground voltage.

Wherein the first plurality of transistors is used as program transistors, and the second and third pluralities of transistors are used as select transistors.

Wherein rupturing of the third transistor includes: sequentially rupturing a fourth transistor among the first plurality of transistors, the fourth transistor disposed closer to the third plurality of transistors than the third transistor in the second direction.

It is to be understood that both the foregoing general description and the following detailed description of the present disclosure are exemplary and explanatory and are intended to provide further explanation of the invention as claimed.

BRIEF DESCRIPTION OF THE DRAWINGS

FIGS. 5(*i*) and 5(*ii*) illustrate a program operation method of the anti-fuse array according to an embodiment.

FIGS. 6(*i*) and 6(*ii*) illustrate a read operation method of the anti-fuse array according to an embodiment.

DESCRIPTION OF EMBODIMENTS

Figure 1:
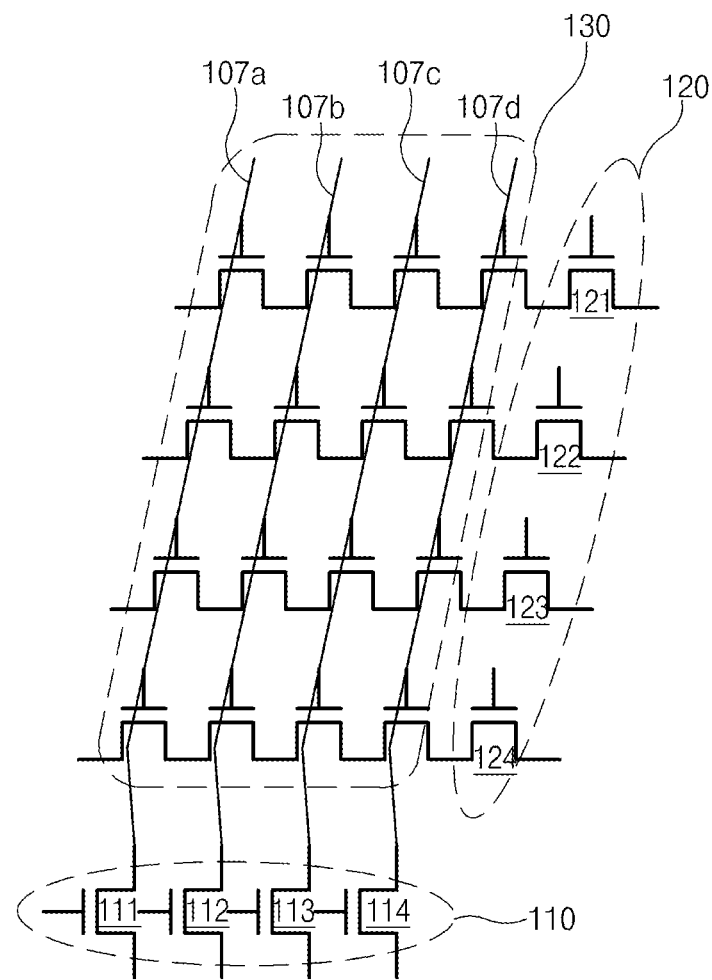
FIG. 1 is a circuit diagram illustrating an anti-fuse array according to an embodiment.

Reference will now be made in detail to certain embodiments of the present disclosure, examples of which are illustrated in the accompanying drawings. Wherever possible, the same reference numbers are used throughout the drawings to refer to the same or like portions. In the following description of embodiments, a detailed description of related known configurations or functions incorporated herein may be omitted for clarity of the subject matter of the present disclosure.

In general, an anti-fuse array includes a plurality of program transistors, a plurality of select transistors, and a plurality of metal contacts. In the anti-fuse array, a program transistor, a select transistor, and a bit line (metal contact) are selected to program a cell that may replace a defective cell.

If a high voltage is applied to a program gate of the program transistor, a gate insulation film of the program transistor may be ruptured due to the voltage difference between the high voltage applied to the program gate and a low voltage received through the bit line. In this case, if a predetermined voltage is applied to a select gate of the select transistor, a channel region is formed below the select gate, such that the high voltage applied to the program gate is output not only through a channel of the select gate but also through the bit line located at a side of the select gate.

In accordance with an embodiment, a two-dimensional (2D) array of program transistors is formed to have a matrix structure in which a plurality of program gate lines and a plurality of channel lines intersect to form the program transistors, and a select transistor is formed adjacent to an end of each program gate line and at an end of each channel line. For example, a power supply voltage may be applied using a select transistor coupled to a selected gate line and a ground voltage may be applied using a select transistor coupled to a selected channel line. As a result, a gate insulation film of a program transistor, which is located at the intersection of the selected gate line and the selected channel line, becomes ruptured to program the program transistor.

A conventional anti-fuse array has a plurality of units, each of which includes one program transistor and one select transistor, so that the number of program transistors is substantially the same as that of select transistors. According to an embodiment of the present disclosure, since one select transistor corresponds to a plurality of program transistors coupled a gate line or a channel line, the number of select transistors can be lower than the number of program transistors. Since the number of select transistors in such an embodiment is less than that in a conventional anti-fuse array, with respect to the same number of program transistors, the region of the anti-fuse array according to this embodiment is reduced in size, compared to that in the conventional anti-fuse array.

Embodiments of the present disclosure will hereinafter be described with reference to FIGS. 1 to 6.

Figure 2:
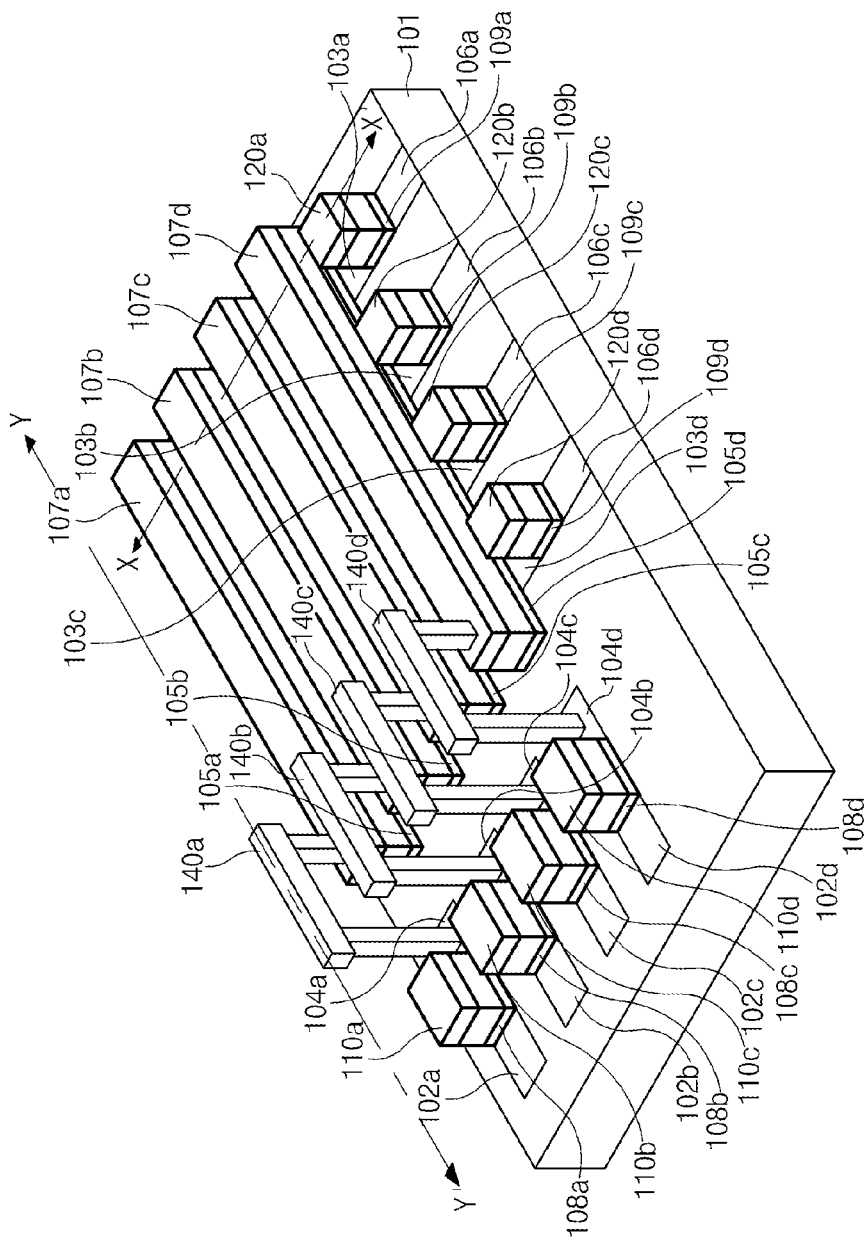
FIG. 2 is a perspective view illustrating an anti-fuse array according to an embodiment.
Figure 3:
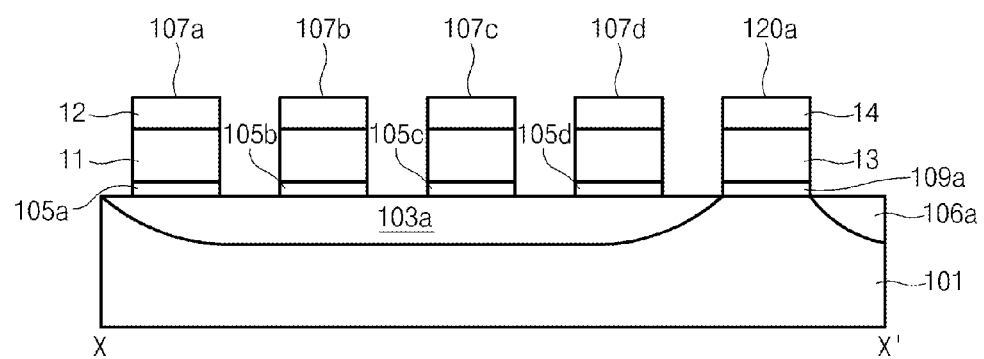
FIG. 3 is a cross-sectional view illustrating the anti-fuse array taken along the line X-X' of FIG. 2.
Figure 4:
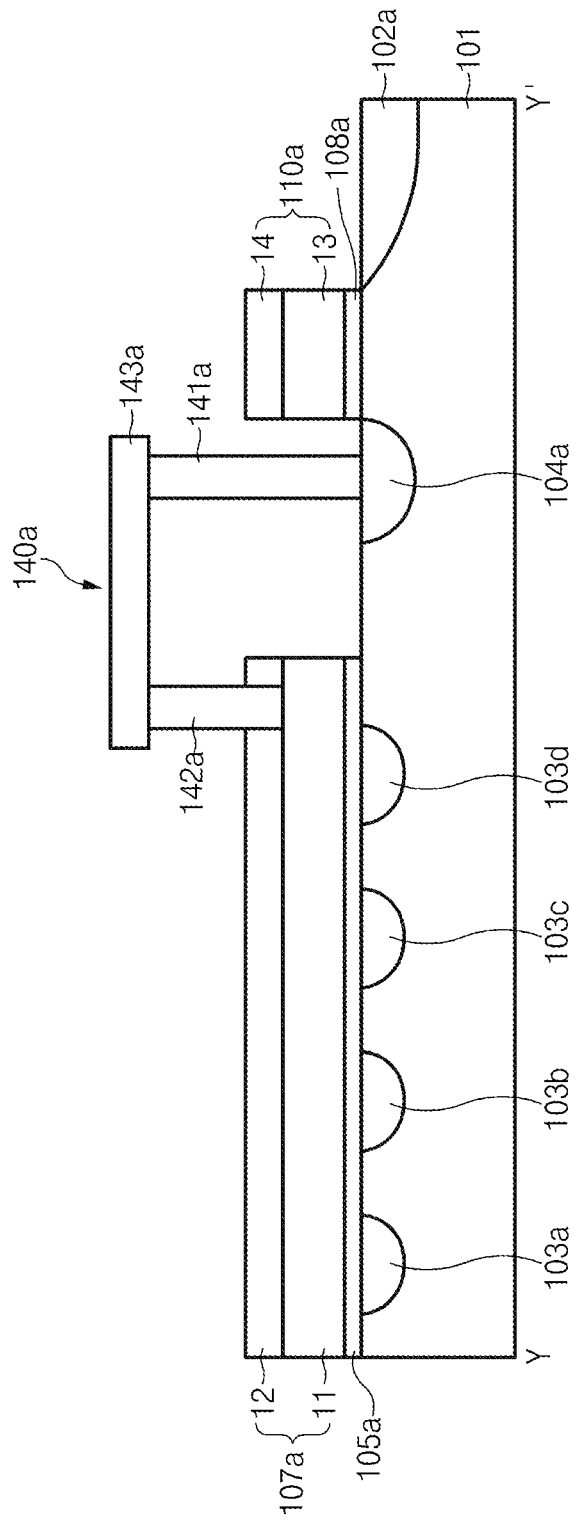
FIG. 4 is a cross-sectional view illustrating the anti-fuse array taken along the line Y-Y' of FIG. 2.

FIG. 1 is a circuit diagram illustrating an anti-fuse array according to an embodiment. FIG. 2 is a perspective view illustrating an anti-fuse array according to an embodiment. FIG. 3 is a cross-sectional view illustrating the anti-fuse array taken along the line X-X' of FIG. 2. FIG. 4 is a cross-sectional view illustrating the anti-fuse array taken along the line Y-Y' of FIG. 2.

Referring to FIG. 1, the anti-fuse array according to this particular embodiment includes a 2D array of program transistors (or first transistors) 130 arranged as a matrix, a first plurality of select transistors (or second transistors) 110, and a second plurality of select transistors (or third transistors) 120. The first plurality of select transistors 110 is formed adjacent to end portions of the 2D array of the program transistors 130. Each of select transistors (111~114) of the first plurality of select transistors 110 and a plurality of corresponding first transistors coupled to each select transistor (111~114) are arranged in a first direction (e.g., Y-Y' direction of FIG. 2). The second plurality of select transistors 120 is formed adjacent to end portions of the 2D array of the program transistors 130. Each select transistor (121~124) of the second plurality of select transistors 120 and a plurality of corresponding first transistors coupled to each select transistor (121~124) are arranged in a second direction (e.g., X-X' direction of FIG. 2).

Referring to FIGS. 1 and 2 showing the anti-fuse array structure according to an embodiment, a plurality of channel lines (103a~103d) is spaced apart from each other by a predetermined distance and extend in the second direction (e.g., X-X' direction) and a plurality of gate lines (107a~107d) is spaced apart from each other by a predetermined distance and extend in the first direction (e.g., Y-Y' direction), thereby forming the 2D array of program transistor 130. In an embodiment, the first direction is perpendicular to the second direction. Each program transistor may be formed at an intersection point of the plurality of gate lines (107a~107d) and the plurality of channel lines (103a~103d).

In this particular embodiment, the channel lines (103a~103d) may be formed by ion implantation, or may be formed by deposition of a material capable of being used as a channel. In an embodiment, the channel lines comprise heavily doped regions of the semiconductor substrate. In addition, gate insulation film lines (105a~105d) may be formed between the semiconductor substrate 101 and the gate lines (107a~107d), such that the gate insulation film lines (105a~105d) and the gate lines (107a~107d) have a stacked structure.

The gate insulation film lines (105a~105d) and the gate lines (107a~107d) may be formed by first forming a gate insulation film material and then forming a gate conductive material over an entire surface of the semiconductor substrate 101. The gate insulation film material and the gate conductive material are then etched to form lines using a mask, such that the gate insulation film lines (105a~105d) and the gate lines (107a~107d) are formed. In an embodiment, as illustrated in FIG. 3, the gate lines (107a~107d) may include a capping film 12 formed on top of the gate conductive material 11. The gate conductive material 11, 13 may be formed of one or more conductive materials such as polysilicon, tungsten, and the like.

The first plurality of select transistors 110 is spaced apart from the gate lines (107a~107d) by a predetermined distance adjacent to the end portions of the gate lines (107a~107d) of the 2D array of program transistors 130. Referring to FIG. 1, the first plurality of select transistors (111~114) may be coupled to the gate lines (107a~107d), respectively. Referring to FIG. 2, the first plurality of select transistors 110 includes select gates (110a~110d) formed over the semiconductor substrate 101 between first channel regions (102a~102d) and second channel regions (104a~104d), respectively; and gate insulation film (108a~108d) formed between the semiconductor substrate 101 and the select gates (110a~110d). In addition, the first plurality of select transistors 110 may be electrically coupled to the 2D array of program transistors 130 through a plurality of metal structures (140a~140d).

The second plurality of select transistors 120 is coupled to the channel lines (103a~103d) at the end portions of the channel lines (103a~103d) of the 2D array of program transistors 130. As can be seen from FIG. 1, the select transistors (121~124) correspond to the channel lines (103a~103d), respectively. The second plurality of select transistors 120 includes gate insulation films (or select gate insulation films) (109a~109d) formed over a region between the channel lines (103a~103d) and third channel regions (106a~106d); and select gates (120a~120d) formed over the gate insulation films (109a~109d). In addition, the second plurality of select transistors 120 may be electrically coupled to the plurality of program transistors 130 using the channel lines (103a~103d).

In an embodiment, not only the gate insulation films (108a~108d) and the select gates (110a~110d) of the first plurality of select transistors 110, but also the gate insulation films (108a~108d) and the select gates (120a~120d) of the second plurality of select transistors 120, can be simultaneously formed when the gate insulation film lines (105a~105d) and the gate lines (107a~107d) of the 2D array of program transistors 130 are formed. In addition, the select gates (110a~110d) of the first plurality of select transistors 110 and the select gates (120a~120d) of the second plurality of select transistors 120 may be formed by stacking a gate conductive material 13 and a capping film 14, as shown in FIG. 3. The gate conductive material 13 may include one or more conductive materials such as polysilicon, tungsten, and the like.

The connection relationship among the program transistors 130 and the select transistors (110, 120) will hereinafter be described in more detail with reference to FIGS. 3 and 4. FIG. 3 is a cross-sectional view of the anti-fuse array taken along the line X-X' of FIG. 2, and FIG. 4 is a cross-sectional view of the anti-fuse array taken along the line Y-Y' of FIG. 2.

Referring to FIG. 3, the channel lines (103a~103d) are formed in a line type extending to one side of a select gate 120a, and the third channel region 106a is formed at the other side of the select gate 120a. The channel line 103a and the channel region 106a are used as a drain region or a source region, such that the channel line 103a, the channel region 106a, and the select gate 120a act as the select transistor 121 (see FIG. 1). In addition, a plurality of gate insulation film lines (105a~105d) spaced apart from each other by a first predetermined distance and a plurality of gate lines (107a~107d) spaced apart from each other by a second predetermined distance are stacked over the channel line 103a.

Referring to FIG. 4, a plurality of channel lines (103a~103d) may be spaced apart from each other by a predetermined distance in the semiconductor substrate 101. In addition, the gate insulation film line 105a and the gate line 107a are stacked in a line type over the channel lines (103a~103d) along a direction that is perpendicular to the channel lines (103a~103d). As a result, a 2D array of the program transistors 130 (see FIG. 1) can be formed at the intersections of the channel lines (103a~103d) and the gate lines (107a~107d).

In addition, a first plurality of select transistors 110 (see FIG. 1) is spaced apart from end portions of the gate lines (107a~107d) by a predetermined distance along a longitudinal direction of the gate lines (107a~107d). A select transistor 111 (see FIG. 1) includes a gate insulation film 108a formed over a region between a first channel region 102a and a second channel region 104a; and a select gate 110a formed over the gate insulation film 108a.

As shown in FIG. 2, a plurality of metal structures (140a~140d) is formed to interconnect the 2D array of program transistors 130 and the first plurality of select transistors 110. As shown in FIG. 4, a first metal structure 140a includes a metal contact (or second metal contact) 141a formed over the second channel region 104a, a metal contact (or first metal contact) 142a formed over the gate line 107a, and a metal line 143a formed to interconnect the first and second metal contacts 142a and 141a. As a result, the plurality of metal structures (140a~140d) may be formed to couple the gate lines (107a~107d) to the select gates (110a~110d) of the first plurality of select transistors 110, respectively.

Referring to a cross-sectional view of FIG. 4, the metal contact (first metal contact) 142a is formed over the gate line 107a, and the metal contact (second metal contact) 141a is formed over and electrically connected to the second channel region 104a corresponding to the select gate 110a, and the metal contacts 141a and 142a are coupled to a metal line 143a. Accordingly, the gate line 107a of a plurality of program transistors along the longitudinal direction the gate line 107a and the second channel region 104a of the select transistor 111 (see FIG. 1) are electrically interconnected through the first metal structure 140a including the metal contacts (141a, 142a) and the metal line 143a.

As describe above, the 2D array of program transistors 130 (see FIG. 1) is formed through the gate lines (107a~107d) and the channel lines (103a~103d) crossing each other. The first and second pluralities of select transistors (110, 120) are formed adjacent to end portions (e.g., the end of the channel lines 103a~103d and the end of the gate lines 107a~107d) of the 2D array of program transistors 130 so as to select at least one of the program transistors 130.

As described above, one select transistor corresponds to one gate line coupled to a first plurality of program transistors along the longitudinal direction of the gate line, and one select transistor corresponds to one channel line coupled to a second plurality of program transistors along the longitudinal direction of the channel line. As a result, since the number of select transistors is reduced compared to that in a conventional anti-fuse array, a region of the anti-fuse array in embodiments of the present disclosure is reduced in size.

A method for operating the anti-fuse array according to an embodiment will hereinafter be described with reference to FIGS. 5 and 6.

FIGS. 5(i) and 5(ii) illustrate a program operation method of the anti-fuse array according to an embodiment.

Referring to FIG. 5(i), it is assumed that no voltage is supplied through first and second pluralities of select transistors (110, 120) during an initial state, so that the outputs of the select transistors (110, 120) to the 2D array of program transistors are in a floating state. Then, in order to select a program transistor to be programmed (that is, to be ruptured), a pair of select transistors corresponding to the program transistor is turned on. As can be seen from FIG. 5(i), in order to program two program transistors (A, B), the select transistors (121, 123) among the second plurality of select transistors 120 and the select transistor 112 among the first plurality of select transistors 110 are turned on to apply a voltage VDD to the program transistors (A, B) through the select transistor 112 and a ground voltage through the select transistors (121, 123). As a result, gate insulation films of the program transistors (A, B) are ruptured to program the program transistors (A, B).

For example, if a ground voltage is applied using the select transistors (121, 123) connected to the channel lines (103a, 103c), and a power-supply voltage VDD is applied using the select transistor 112 coupled to the gate line 107b, a voltage level difference across the gate insulation film of the program transistors (A, B) located at the intersections of the gate line 107b and the channel lines (103a, 103c) is sufficiently high that a gate insulation film of the program transistors (A, B) is ruptured. However, the remaining gate lines (107a, 107c, 107d) and the remaining channel lines (103b, 103d) are maintained in a floating state, so that the other program transistors located at intersections of the remaining channel lines (103b, 103d) and the remaining gate lines (107a, 107c, 107d) are not programmed.

In an embodiment, the program operation may be sequentially carried out in a first direction. The first direction corresponds to a horizontal direction from a left side to a right side of the 2D array of program transistors shown in FIGS. 5(i) and 5(ii).

Referring to FIG. 5(ii), after the program transistors (A, B) coupled to the gate line 107b are ruptured, the program transistors coupled to the gate line 107c (C, D) are ruptured. Subsequently, the program transistors coupled to the gate line 107d may be ruptured.

On the other hand, after program transistors coupled to the gate line 107c have been ruptured, program transistors coupled to the gate line 107b may not be ruptured due to a leakage current through the ruptured transistors, as will be described below.

For example, after the program transistors (C, D) shown in FIG. 5(ii) are ruptured, the program transistors (A, B) are selected by applying a power supply voltage VDD through the gate line 107b and a ground voltage through the channel lines (103a, 103c). Since the program transistor D has been ruptured, it acts as a short, so that when a voltage level difference across the gate insulation film of the program transistor B is applied to rupture the program transistor B, a leakage current may flow through the ruptured program transistor D, which is located at the right side of the program transistor B along the channel line 103c. As a result, a voltage level difference across the gate insulation film of program transistor B is reduced, and the voltage level difference may not be sufficiently high to rupture the program transistor B.

Accordingly, the anti-fuse according to this embodiment may sequentially rupture program transistors along a direction toward the second plurality of select transistors 120, which is disposed adjacent to end portions of the 2D array of program transistors 130.

FIGS. 6(i) and 6(ii) are illustrate a read operation method of the anti-fuse array according to an embodiment.

Referring to FIG. 6(i), it is assumed that no voltage is applied using first and second pluralities of select transistors (110, 120) during an initial state, so that the outputs of the select transistors (110, 120) connected to the program transistors are in a floating state.

Then, in order to read a program transistor E located at an intersection point of the channel line 103b and the gate line 107c, a read voltage (VRD) is applied using the select transistor 113 connected to the gate line 107c and a ground voltage is applied using the select transistor 122 coupled to the channel line 103b. Because the program transistor E has already been ruptured by a programming operation, a current corresponding to the voltage difference between the read voltage (VRD) and the ground voltage flows through the program transistor E. As a result, a read operation of the program transistor E can be performed using a value of the current flowing through the program transistor E. In an embodiment, the current value may be measured using an additional device. Various types of fuse reading technology for measuring the current value and reading "1" or "0" according to the measured current value can be used.

For example, if a current value is equal to or higher than a predetermined level, the fuse value may be set to "1" and the corresponding program transistor (or fuse) may be determined as a programmed fuse. If a current value is less than the predetermined level, the fuse value may be set to "0" and the corresponding program transistor (or fuse) may be determined as an unprogrammed fuse, as will be described below with reference to FIG. 6(ii).

A non-ruptured program transistor (E') is shown in FIG. 6(ii). In order to read the program transistor (E'), a read voltage (VRD) is applied using the select transistor 113 coupled to the gate line 107c, and a ground voltage is applied using the select transistor 122 coupled to the channel line 103b. In an embodiment, the read voltage (VRD) has a lower voltage level than that of the power supply voltage (VDD). Because the program transistor (E') is not ruptured and remains in an open state, no current flows through the program transistor (E').

As a result, when a level of a current flowing through the program transistor (E') is measured, the current level may be less than a predetermined value.

As described above, a 2D array of program transistors is formed, a first select transistor including a select gate is formed adjacent to the end of each program gate line, and a second select transistor including a select gate is formed at the end of each channel line. A predetermined voltage may be applied using the first select transistor coupled to a selected gate line and a ground voltage may be applied using a second select transistor coupled to a selected channel line. As a result, a gate insulation film of a program transistor, which is located at the intersection of the selected gate line and the selected channel line, becomes ruptured to program the selected program transistor. As a result, compared to a conventional anti-fuse array structure in which one program transistor corresponds to one select transistor, since one select transistor corresponds to a plurality of program transistors according to an embodiment of the present disclosure, the region of the anti-fuse array can be reduced in size, thereby increasing productivity of manufacturing a semiconductor device including the anti-fuse array.

Embodiments may be carried out in other ways than those specifically described herein. Embodiments are construed as illustrative and not restrictive.

The above embodiments of the present invention are illustrative and not limitative. Variations and modifications are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device.

What is claimed is:

1. An anti-fuse array comprising:
    a plurality of first transistors having a matrix structure over a semiconductor substrate, the plurality of first transistors including a plurality of gate lines extending along a first direction, a plurality of channel lines extending along a second direction, and a plurality of gate insulation film lines extending in the first direction to overlap portions of the plurality of channel lines;
    a plurality of second transistors respectively disposed adjacent to first ends of the plurality of gate lines; and
    a plurality of third transistors respectively disposed at second ends of the plurality of channel lines.

2. The anti-fuse array according to claim 1, wherein the plurality of first transistors are used as program transistors, and the pluralities of second and third transistors are used as select transistors.

3. The anti-fuse array according to claim 1, wherein the plurality of channel lines are spaced apart from each other by a predetermined distance, and
    wherein the plurality of gate lines are disposed over the plurality of gate insulation film lines to overlap portions of the plurality of channel lines.

4. The anti-fuse array according to claim 1, wherein
    the plurality of gate insulation film lines are disposed perpendicular to the plurality of channel lines, and
    wherein the plurality of gate lines are disposed over the gate insulation film lines.

5. The anti-fuse array according to claim 1, wherein the plurality of channel lines is formed by ion implantation.

6. The anti-fuse array according to claim 1, wherein at least one third transistor among the plurality of third transistors includes:
    a first channel region disposed in the semiconductor substrate;
    a second channel region disposed in the semiconductor substrate and spaced apart from the first channel region by a predetermined distance, the second channel region being coupled to a portion of a channel line;
a select gate insulation film disposed over a region between the first channel region and the second channel region; and
a gate electrode disposed over the select gate insulation film.

7. The anti-fuse array according to claim 6, wherein the first channel region and the second channel region are simultaneously formed by ion implantation when the corresponding channel line is formed.

8. The anti-fuse array according to claim 1, wherein the first direction is substantially perpendicular to the second direction.

9. The anti-fuse array according to claim 1, wherein at least one second transistor among the plurality of second transistors includes:
first and second channel regions disposed in the semiconductor substrate and spaced apart from each other by a predetermined distance;
a select gate insulation film disposed over a region between the first and second channel regions; and
a gate electrode disposed over the gate insulation film.

10. The anti-fuse array according to claim 4, wherein at least one second transistor among the plurality of second transistors is spaced apart from an end portion of a gate line by a predetermined distance in a longitudinal direction thereof.

11. The anti-fuse array according to claim 4, wherein the plurality of third transistors are electrically coupled to the plurality of channel lines, respectively.

12. The anti-fuse array according to claim 4, further comprising:
a metal structure configured to electrically interconnect a second transistor among the plurality of second transistors and a first group of the plurality of first transistors.

13. The anti-fuse array according to claim 12, wherein the metal structure includes:
a first metal contact coupled to a gate line of the first group of the plurality of first transistors;
a second metal contact coupled to a channel region of the second transistor; and
a metal line configured to interconnect the first metal contact and the second metal contact.

14. The anti-fuse array according to claim 4, wherein the anti-fuse array further comprises a plurality of metal structures, and
wherein the plurality of gate lines are electrically coupled to the plurality of metal structures, respectively.

15. A method for operating an anti-fuse array which includes a plurality of first transistors respectively disposed at crosspoints of a plurality of gate lines and a plurality of channel lines, a plurality of second transistors respectively coupled to the gate lines, and a plurality of third transistors respectively coupled to the plurality of channel lines, the method comprising:
applying a first voltage to the plurality of first transistors using at least one transistor among the plurality of second transistors;
applying a second voltage to the plurality of first transistors using at least one transistor among the plurality of third transistors; and
rupturing corresponding ones of the first transistors that received the first voltage and the second voltage,
wherein rupturing the corresponding ones of the first transistors includes:
after rupturing of a fourth transistor, rupturing a fifth transistor, the fifth transistor disposed closer to the third transistor than the fourth transistor on a common channel line.

16. The method according to claim 15, wherein, during a program operation, the first voltage is a power-supply voltage (VDD), and the second voltage is a ground voltage.

17. The method according to claim 15, further comprising:
applying a third voltage to the plurality of first transistors using at least one transistor among the plurality of second transistors, and applying a fourth voltage to the plurality of first transistors using at least one transistor among the plurality of third transistors, and performing a read operation on a transistor that received the third voltage and the fourth voltage.

18. The method according to claim 17, wherein, during the read operation, the third voltage is a read voltage, and the fourth voltage is a ground voltage.

19. The method according to claim 15, wherein the plurality of first transistors are used as program transistors, and the pluralities of second and third transistors are used as select transistors.

20. A method for operating an anti-fuse array which includes a plurality of first transistors formed as a matrix structure over a semiconductor substrate, a plurality of second transistors respectively formed adjacent to first ends of the plurality of first transistors along a first direction of the matrix structure, and a plurality of third transistors respectively formed at second ends of the plurality of first transistors along a second direction, the method comprising:
applying a first voltage to the plurality of first transistors using a corresponding one of the plurality of second transistors;
applying a second voltage to the plurality of first transistors using a corresponding one of the plurality of third transistors;
rupturing a fourth transistor among the plurality of first transistors located at an intersection of a gate line coupled to the corresponding one of the plurality of second transistors and a channel line coupled to the corresponding one of the plurality of third transistors due to a voltage level difference across a gate insulation film of the fourth transistor corresponding to a difference between the first voltage and the second voltage; and
after rupturing of the fourth transistor, rupturing a fifth transistor among the plurality of first transistors, the fifth transistor disposed closer to the plurality of third transistors than the fourth transistor in the second direction.

* * * * *